US00RE45557E

(19) United States
(12) Reissued Patent
Caresosa et al.

(10) Patent Number: US RE45,557 E
(45) **Date of Reissued Patent: *Jun. 9, 2015**

(54) CONFIGURABLE VOLTAGE CONTROLLED OSCILLATOR SYSTEM AND METHOD INCLUDING DIVIDING FORMING A PORTION OF TWO OR MORE DIVIDER PATHS

(71) Applicant: Broadcom Corporation, Irvine, CA (US)

(72) Inventors: Mario Caresosa, San Clemente, CA (US); Namik Kocaman, San Clemente, CA (US); Afshin Momtaz, Laguna Hills, CA (US)

(73) Assignee: Broadcom Corporation, Irvine, CA (US)

( * ) Notice: This patent is subject to a terminal disclaimer.

(21) Appl. No.: 13/935,098

(22) Filed: Jul. 3, 2013

Related U.S. Patent Documents

Reissue of:
(64) Patent No.: 7,053,720
Issued: May 30, 2006
Appl. No.: 11/049,163
Filed: Feb. 2, 2005

U.S. Applications:
(63) Continuation of application No. 10/444,022, filed on May 22, 2003, now Pat. No. 6,864,752.

(60) Provisional application No. 60/423,074, filed on Nov. 1, 2002.

(51) Int. Cl.
*H03L 7/18* (2006.01)

(52) U.S. Cl.
CPC ..... *H03L 7/18* (2013.01)

(58) Field of Classification Search
USPC ..... 327/156–159; 331/1 A, 2, 16, 18, 25, 331/46, 49, 56, 57, 74, 75; 332/127; 360/51; 375/376; 455/260
See application file for complete search history.

(56) References Cited

U.S. PATENT DOCUMENTS

| | | | | |
|---|---|---|---|---|
| 5,260,979 | A * | 11/1993 | Parker et al. | 375/366 |
| 5,929,711 | A * | 7/1999 | Ito | 331/1 A |
| 6,163,186 | A * | 12/2000 | Kurita | 327/157 |
| 6,236,632 | B1 * | 5/2001 | Hayashi | 369/59.16 |
| 6,285,640 | B1 * | 9/2001 | Hayashi et al. | 369/47.29 |
| 6,587,411 | B2 * | 7/2003 | Hayashi | 369/47.29 |
| 6,687,320 | B1 * | 2/2004 | Chiu et al. | 375/376 |
| 6,864,752 | B2 * | 3/2005 | Caresosa et al. | 331/16 |
| 6,960,962 | B2 * | 11/2005 | Peterzell et al. | 331/40 |
| 7,034,599 | B1 * | 4/2006 | Agrawal et al. | 327/291 |
| 7,053,720 | B2 | 5/2006 | Caresosa et al. | |
| 7,084,712 | B2 * | 8/2006 | Fujiwara | 331/51 |
| 7,123,101 | B2 * | 10/2006 | Puma et al. | 331/16 |
| 7,324,548 | B2 | 1/2008 | Natarajan et al. | |

(Continued)

FOREIGN PATENT DOCUMENTS

EP 1 416 656 A2 5/2004

*Primary Examiner* — Levi Gannon
(74) *Attorney, Agent, or Firm* — Sterne, Kessler, Goldstein & Fox P.L.L.C.

(57) ABSTRACT

A phase lock loop with multiple divider paths is presented herein. The phase lock loop can be used to provide a wide range of frequencies. The phase lock loop can also be used as a portion of a clock multiplier unit or a clock data and recovery unit.

29 Claims, 5 Drawing Sheets

(56) References Cited

U.S. PATENT DOCUMENTS

| | | | | |
|---|---|---|---|---|
| 7,356,076 | B2 | 4/2008 | Xiao et al. | |
| 7,391,788 | B2 | 6/2008 | Zhang et al. | |
| 7,391,838 | B2 | 6/2008 | Caresosa et al. | |
| 7,428,274 | B2 * | 9/2008 | Joisson et al. | 375/334 |
| 7,496,133 | B2 | 2/2009 | Fujimori et al. | |
| 7,598,815 | B2 * | 10/2009 | Chen et al. | 331/16 |
| 7,928,807 | B2 * | 4/2011 | Mishra | 331/22 |
| 8,160,109 | B2 | 4/2012 | Proano et al. | |
| 2004/0047440 | A1 * | 3/2004 | Momtaz et al. | 375/376 |
| 2008/0130679 | A1 | 6/2008 | Natarajan et al. | |

* cited by examiner

CONFIGURABLE VOLTAGE CONTROLLED OSCILLATOR SYSTEM AND METHOD INCLUDING DIVIDING FORMING A PORTION OF TWO OR MORE DIVIDER PATHS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATIONS

This application is a continuation of Non Provisional Application U.S. Ser. No. 10/444,022, filed on May 22, 2003, now U.S. Pat. No. 6,864,752 which claims benefit of Provisional Application U.S. Ser. No. 60/423,074, "Configurable Voltage Controlled Oscillator System and Method", filed Nov. 1, 2002, by Caresosa, et. al.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The present invention relates to Optical Internetworking, and more particularly to a multi-rate transceiver with Rate Adaptation.

Synchronous Optical Networking (SONET) is a standard way to multiplex high-speed traffic from multiple vendors' multiplexers onto fiber optic cabling. SONET equipment and software enable network providers to carry traffic from many types of customer equipment in a uniform way on backbone fiber optic cabling.

SONET is slightly different in the long haul space compared to the metro space. [The long haul space is [please fill in the blank with a brief description of the long haul space]. The metro space is [please fill in the blank with a brief description of the metro space].] SONET for the metro space provides additional functionality for other protocols, such as Gigabit Ethernet, ESCON, FIBERCON, Fiber Channel 2X, and HDTV, to name a few.

Service providers provide services to various customers by provisioning a line card for the customer. Line cards handle one of a several standard rates. TABLE 1 identifies a list of different rates. In order to provide customers with different data rates, service providers install different line cards, wherein each line card handles a different data rate. In cases where a service provider has many customers, it is likely that the service provider has many line cards to accommodate the different user requirements. However, in cases where a service provider has fewer customers, it is likely that the service provider will need to purchase a new line card to accommodate a new customer with different rate requirements.

TABLE 1

| Optical Level | Electrical Level | Line Rate (Mbps) | Payload Rate (Mbps) | Overhead Rate (Mbps) |
|---|---|---|---|---|
| OC-1 | STS-1 | 51.840 | 50.112 | 1.728 |
| OC-3 | STS-3 | 155.520 | 150.336 | 5.184 |
| OC-9 | STS-9 | 466.560 | 451.008 | 15.552 |
| OC-12 | STS-12 | 622.080 | 601.344 | 20.736 |
| OC-18 | STS-18 | 933.120 | 902.016 | 31.104 |
| OC-24 | STS-24 | 1244.160 | 1202.688 | 41.472 |
| OC-36 | STS-36 | 1866.240 | 1804.032 | 62.208 |
| OC-48 | STS-48 | 2488.320 | 2405.376 | 82.944 |

In order to provide different data rates from the same infrastructure, reference clock signals with different frequencies are needed.

Accordingly it would be advantageous to provide a voltage controlled oscillator (VCO) which can provide signals of multiple frequencies.

Further limitations and disadvantages of connection and traditional approaches will become apparent to one of skill in the art, through comparison of such systems with embodiments of the present invention as set forth in the remainder of the present application.

BRIEF SUMMARY OF THE INVENTION

Presented herein is a phase lock loop with multiple divider paths. A particular one of the divider paths can be selected, thereby allowing for generation of an output signal with any one of a plurality of frequencies. The phase lock loop can form a portion of a clock and data recovery unit (CDR) or a clock management unit (CMU) in a multirate transceiver.

These and other advantages, aspects and novel features of the present invention, as well as details of illustrated embodiments thereof, will be more fully understood from the following description and drawings.

DETAILED DESCRIPTION OF THE INVENTION

Figure 1:
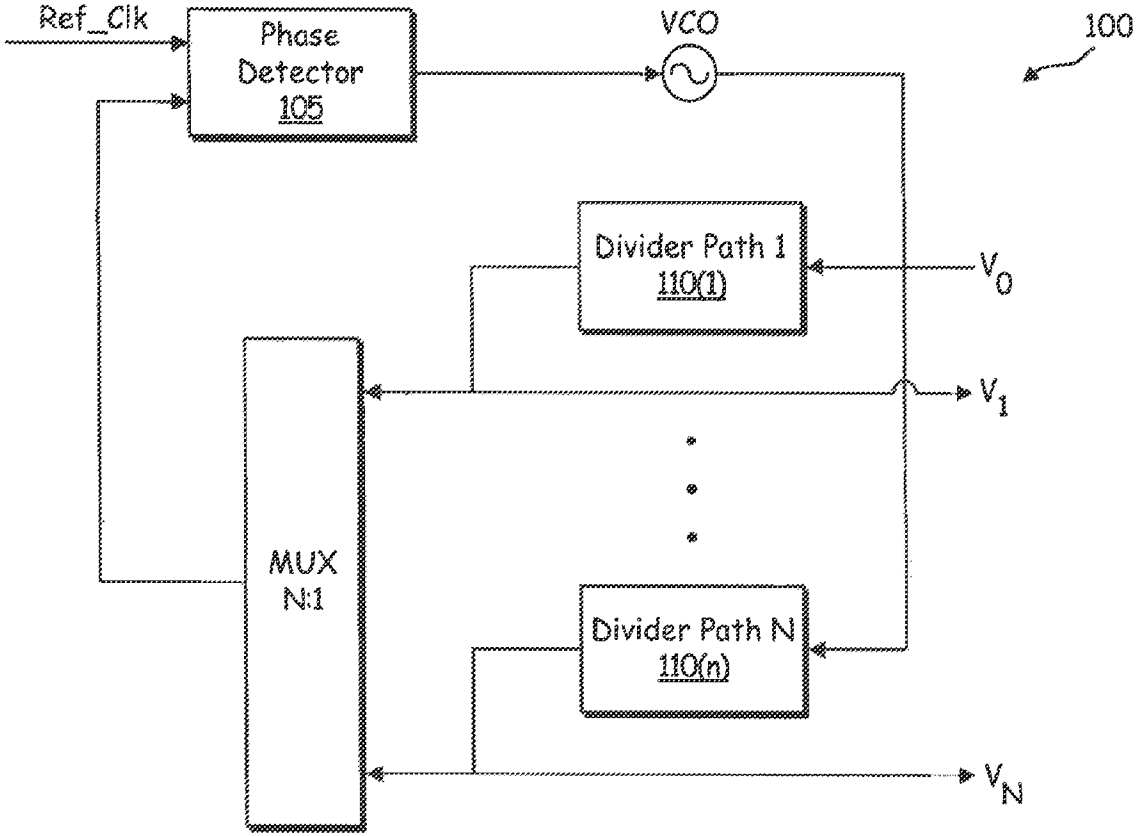
FIG. 1 is a block diagram of an exemplary phase lock loop with multiple divider paths in accordance with an embodiment of the invention.

Referring now to FIG. 1, there is illustrated a block diagram of an exemplary phase lock loop 100 in accordance with an embodiment of the present invention. The phase lock loop 100 synchronizes [an] *a* reference clock signal, ref_clk, to a signal with any one of a plurality of different frequencies, $f_1 \ldots f_n$ thereby providing a plurality of output signals $V_1 \ldots V_n$ with different frequencies.

The reference clock signal, ref_clk, is received at a phase detector 105. The phase detector 105 provides an output signal that is a function of the phase difference between the reference clock signal, ref_clk, and a feedback signal.

The phase lock loop comprises a voltage controlled oscillator (VCO). The VCO is centered at a particular frequency, f. The VCO provides a signal with a frequency that is offset from the center frequency, f. The offset is controllable by the voltage level applied to the VCO.

The output of the VCO is provided to a plurality of divider paths 110(1) . . . 110(n). Each divider path divides the frequency of the signal from VCO by a particular factor, thereby resulting in a plurality of signals $V_1 \ldots V_n$ at different fractions of the VCO frequency. By dividing the frequency of the VCO by a particular factor, the frequency of the VCO is equivalent to the frequency of the reference clock multiplied by the divider factor. The foregoing allows for accurate generation of a higher frequency signal from a reference clock. Inclusion of many divider paths allows numerous different output frequencies to be realized from a single reference clock.

Each of the divider paths 110(1) . . . 110(n) are connected to an N:1 multiplexer, MUX, which selectively feeds back a particular one of the divider paths 110(1) . . . 110(n) to the phase detector 105.

This configurable voltage controlled oscillator of the present invention can also be used in conjunction with the teachings of "Transceiver System and Method Supporting Multiple Selectable Voltage Controlled Oscillators", Provisional Application for Patent Ser. No. 60/423,072, by Caresosa, et. al., which is incorporated herein by reference.

Figure 2:
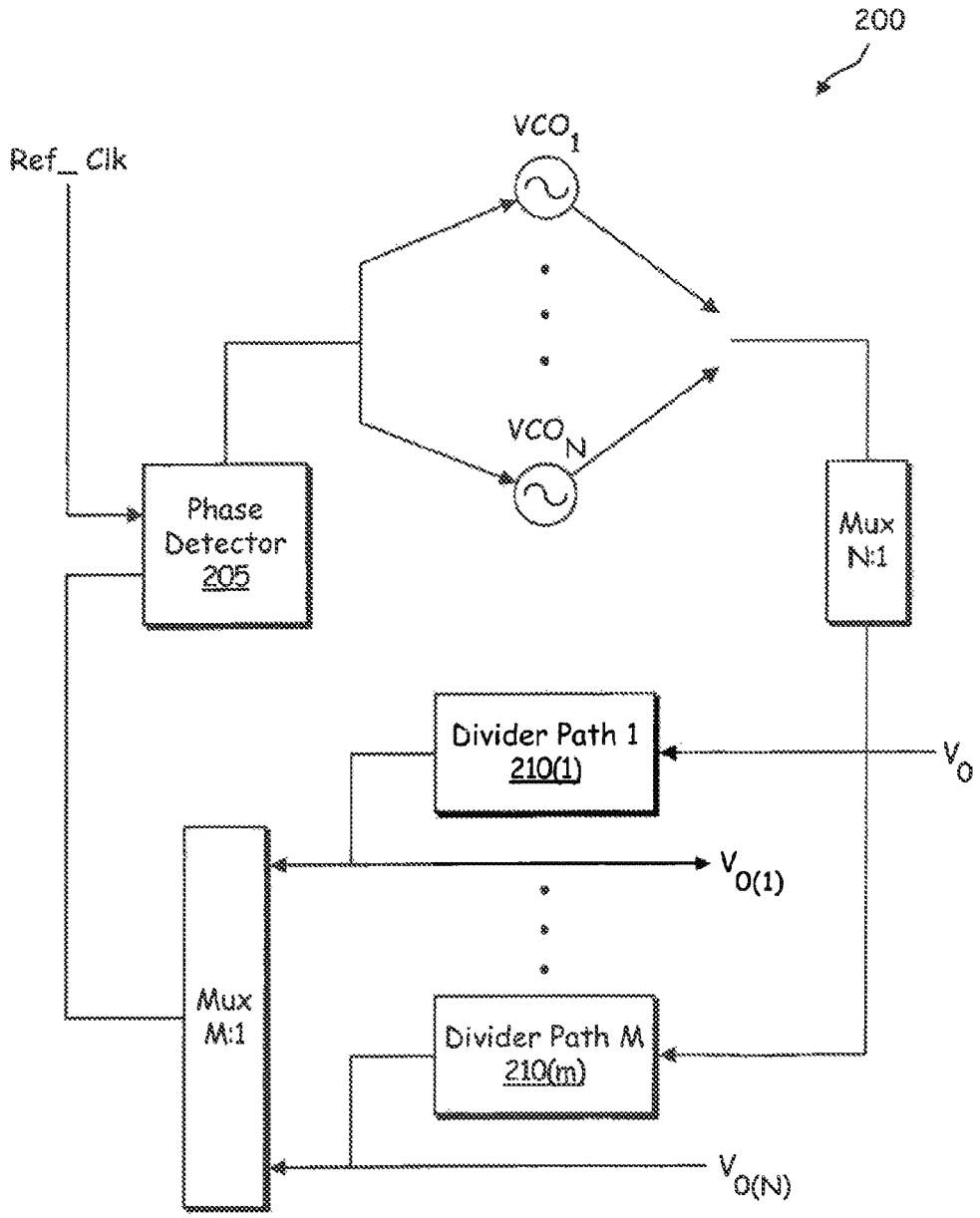
FIG. 2 is a block diagram of an exemplary phase lock loop with multiple voltage oscillators and multiple divider paths in accordance with an embodiment of the present invention.

Referring now to FIG. 2, there is illustrated a block diagram of an exemplary phase lock loop 200 with multiple divider paths and multiple selectable [VCos] *VCOs* in accordance with an embodiment of the present invention. The phase lock loop 200 synchronizes reference clock signal, ref_clk, to a signal with any one of a plurality of different frequencies, thereby providing an output signal $V_{o(l)} \ldots V_{o(m)}$.

The reference clock signal, ref_clk, is received at a phase detector 205. The phase detector 205 provides an output signal that is a function of the phase difference between the reference clock signal, ref_clk, and a feedback signal.

The phase lock loop comprises a plurality of voltage controlled oscillators (VCOs), $VCO_1 \ldots VCO_n$. Each VCO, $VCO_1 \ldots VCO_n$, is centered at a particular frequency, $f_1 \ldots f_n$. The VCOs, $VCO_1 \ldots VCO_n$, provide a signal with a frequency that is offset from the center frequency. The offset is controllable by the voltage level applied to the VCO, $VCO_1 \ldots VCO_n$.

Each of the VCOs, $VCO_1 \ldots VCO_n$ are connected to an N:1 multiplexer, MUX, which selectively connects a particular one of the voltage controlled oscillators to a plurality of divider paths 210. The output of the VCO is provided to a plurality of divider paths 210(1) . . . 210(m). Each divider path divides the signal from the selected VCO by a particular factor, thereby resulting in a plurality of signals $V_{o(l)} \ldots V_{o(m)}$ at different fractions of the VCO center frequency.

Each of the divider paths 210(0) . . . 210(m) are connected to an m:1 multiplexer, MUX, which selectively feeds back a particular one of the divider paths 210(1) . . . 210(m) to the phase detector 205.

Various embodiments of the present invention can be incorporated into a clock and data recovery (CDR) or clock multiplier unit (CMU) in a multirate transceiver, such as the multirate transceiver described in "TRANSCEIVER SYSTEM AND METHOD SUPPORTING VARIABLE RATES AND MULTIPLE PROTOCOLS", Provisional Application for Patent Ser. No. 60/423,070, by Caresosa, et. al., filed Nov. 1, 2002.

Figure 3:
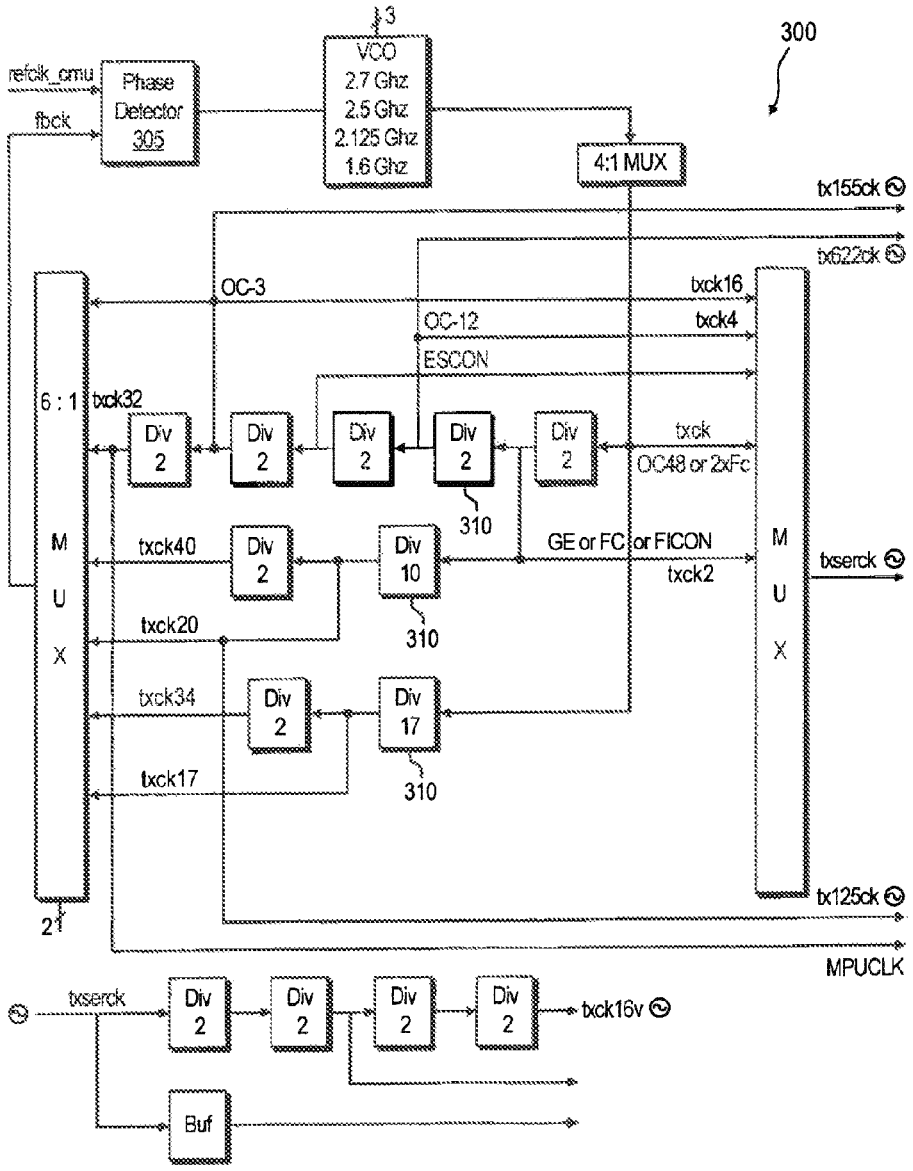
FIG. 3 is a block diagram of a clock multiplier unit in accordance with an embodiment of the present invention.

Referring now to FIG. 3, there is illustrated an exemplary CMU in accordance with an embodiment of the present invention. The CMU 300 synchronizes an reference clock signal, refclk_cmu, to a signal with any one of a plurality of frequencies.

The reference clock signal, refclk_cmu, is received at a phase detector 305. The phase detector 305 provides an output signal that is a function of the phase difference between the reference clock signal, refclk_cmu, and a feedback signal.

The phase lock loop comprises a plurality of VCO. The VCOs are centered at 1.6 Ghz, 2.12 Ghz, 2.5 Ghz, and 2.7 Ghz. The VCOs provide a signal with a frequency that is offset from the center frequency. The offset is controllable by the voltage level applied to the VCO.

Each of the VCOs is connected to an 4:1 multiplexer, MUX, which selectively connects a particular one of the voltage controlled oscillators to a plurality of divider paths 310. The divider paths 310 are realized from DIV 2, DIV 10, and DIV 17 dividers. It is noted that the dividers, DIV, may form a portion of one or more divider paths. The divider paths 310 provide clock signals for OC-3, OC-12, OC-48, ESCON, Gigabit Ethernet, FICON.

The dividers, DIV, provide signals to a 6:1 multiplexer, MUX, which selectively feeds back a particular one of the signals to the phase detector 305.

Additionally, a plurality of signals from the dividers, DIV, are also received at another multiplexer, MUX. The MUX selects a particular one of the plurality of signals and outputs the selected signal, txserck. The output signal, txserck, can also be received at additional dividers, DIV.

The CMU can be configured to output signals with a variety of frequency characteristics by appropriate selection of the reference clock frequency, VCO frequency, and the divider path. Various examples of frequencies that can be achieved, are listed below, along with the reference clock frequency, VCO frequency, and divider paths that can be used to achieve the frequency.

| Data Mode | Ref Clock frequency | VCO Out frequency | Divider Path/Value | txserck frequency |
|---|---|---|---|---|
| SONET Rates | | | | |
| FEC | 1.69E+08 | 2.70E+09 | 2×2×2×2->16 | 2.70E+09 |
| | 8.44E+07 | 2.70E+09 | 2×2×2×2×2->32 | 2.70E+09 |
| OC48 | 1.56E+08 | 2.50E+09 | 2×2×2×2->16 | 2.50E+09 |
| | 7.81E+07 | 2.50E+09 | 2×2×2×2×2->32 | 2.50E+09 |
| OC12 | 1.56E+08 | 2.50E+09 | 2×2×2×2->16 | 2.50E+09 |
| | 7.81E+07 | 2.50E+09 | 2×2×2×2×2->32 | 2.50E+09 |
| OC3 | 1.56E+08 | 2.50E+09 | 2×2×2×2->16 | 2.50E+09 |
| | 7.81E+07 | 2.50E+09 | 2×2×2×2×2->32 | 2.50E+09 |
| Gigabit Ethernet | 1.25E+08 | 2.50E+09 | 2×10->20 | 1.25E+09 |
| | 6.25E+07 | 2.50E+09 | 2×10×2->40 | 1.25E+09 |
| Fibre-Channel | 1.06E+08 | 2.13E+09 | 2×10->20 | 1.06E+09 |
| | 5.31E+07 | 2.13E+09 | 2×10×2->40 | 1.06E+09 |
| | 1.25E+08 | 2.13E+09 | 17 | 1.06E+09 |
| | 6.25E+07 | 2.13E+09 | 2×17->34 | 1.06E+09 |
| 2× Fibre-Channel | 1.06E+08 | 2.13E+09 | 2×10->20 | 2.13E+09 |
| | 5.31E+07 | 2.13E+09 | 2×2×10->40 | 2.13E+09 |
| | 1.25E+08 | 2.13E+09 | 17 | 2.13E+09 |
| | 6.25E+07 | 2.13E+09 | 2×17->34 | 2.13E+09 |
| FICON | 8.00E+07 | 1.60E+09 | 2×10->20 | 8.00E+08 |
| | 4.00E+07 | 1.60E+09 | 2×2×10->40 | 8.00E+08 |
| ESCON | 8.00E+07 | 1.60E+09 | 2×10->20 | 2.00E+08 |
| | 4.00E+07 | 1.60E+09 | 2×2×10->40 | 2.00E+08 |

Figure 4:
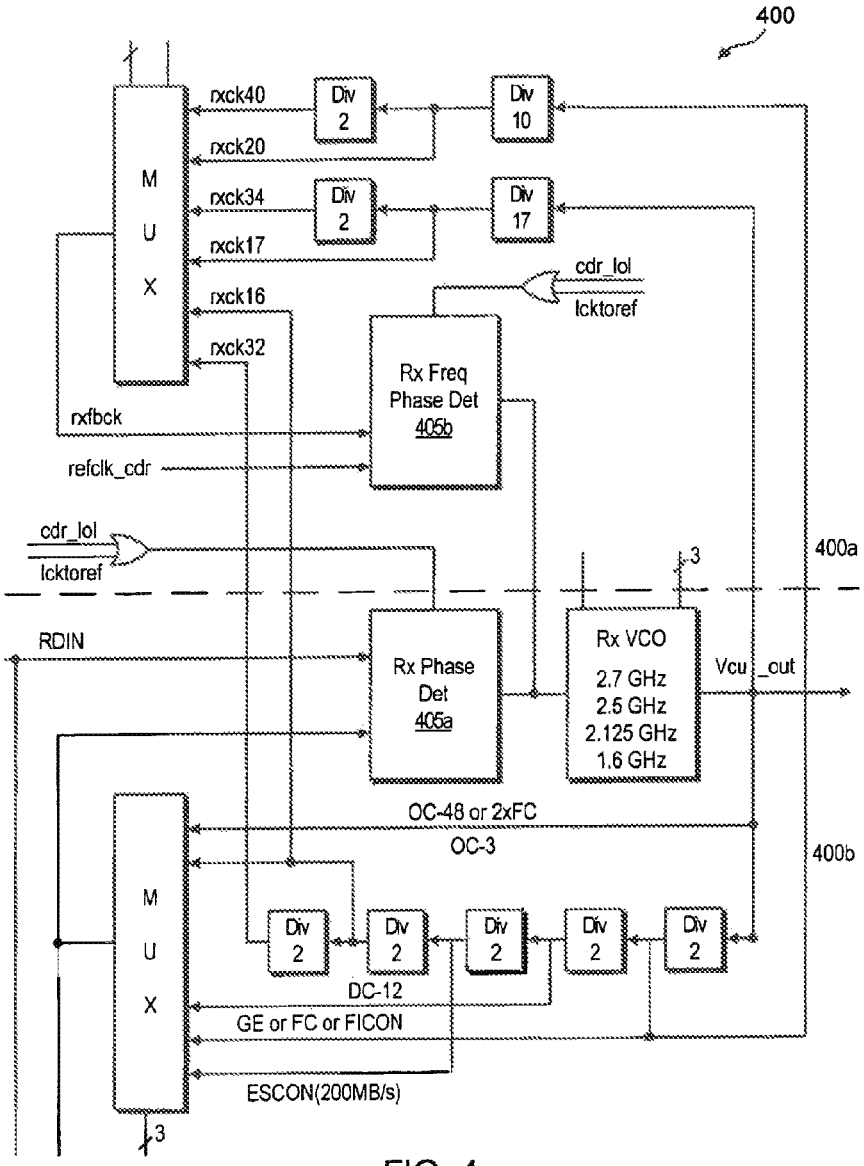
FIG. 4 is a block diagram of an exemplary CDR in accordance with an embodiment of the present invention.

Referring now to FIG. 4, there is illustrated a block diagram of an exemplary CDR 400 in accordance with an embodiment of the invention. The CDR 400 includes a frequency acquisition circuit loop 400a and a phase acquisition loop 400b.

The CDR 400 operates in one of two modes—a frequency acquisition mode, and a phase acquisition mode. At startup, the CDR 400 operates in the frequency acquisition mode wherein the frequency acquisition circuit loop 400a locks the frequency of a reference signal, [efclk_cdr] *refclk_cdr* to a particular one of the frequencies. The particular frequency signal is generated by selection of a particular one of the VCOs in RxVCO and a particular one of the divider paths.

Upon frequency acquisition, the CDR 400 enters the phase acquisition mode. During the phase acquisition mode, the phase acquisition circuit loop 400b synchronizes an incoming data signal with a particular one of the frequencies. The particular frequency signal is generated by selection of a particular one of the VCOs in RxVCO and particular one of the divider paths.

Figure 5:
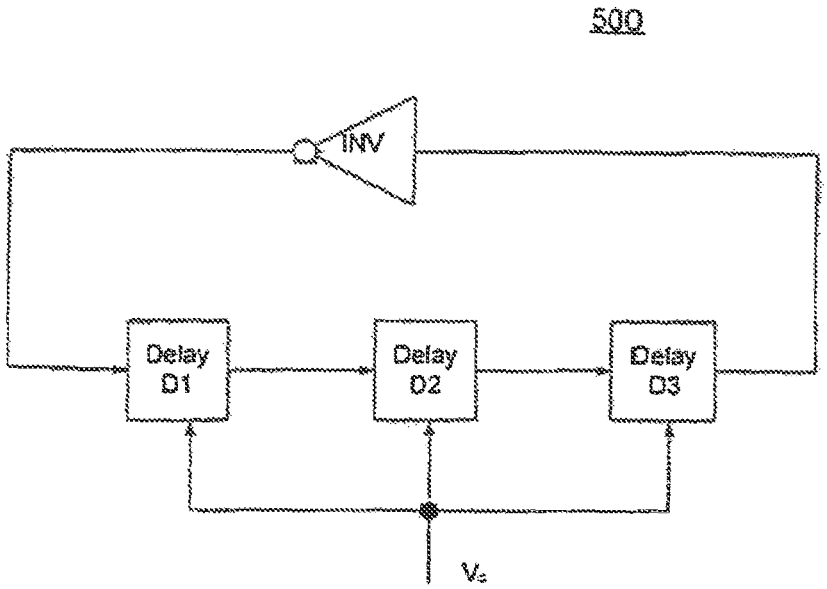
FIG. 5 is a block diagram of an exemplary oscillator.

Referring now to FIG. 5, there is illustrated a block diagram describing an exemplary VCO 500. The VCO 500 comprises delay units, D1, D2, and D3, connected in cascade. The delay units can comprise, for example, delay interpolators. The output of delay unit, D3, is provided is inverted and fed back to delay unit, D1.

The delay units, D1, D2, D3 delay an input signal for a certain period of time, T, before outputting the signal. Accordingly, an input pulse received at delay unit, D1, at time=0 is reaches the output of delay unit, D3, at time=3T. Therefore, the output generates a signal with a frequency, 1/(6T).

The period of time that the delay units, D1, D2, and D3 delay an input signal is controllable by a control voltage, Vc. A particular frequency, within a certain range, can be achieved by controlling the control voltage.

Figure 6:
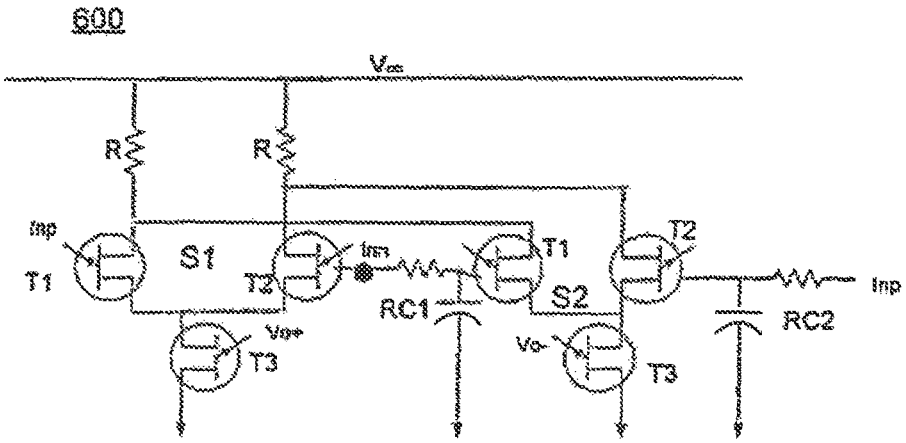
FIG. 6 is a block diagram of an exemplary delay unit.

Referring now to FIG. 6, there is illustrated a block diagram describing an exemplary delay interpolator. The delay interpolator comprises two stages, S1, S2. Each stage provides a different delay period, $T_{S1}$, $T_{S2}$. The delay period for the interpolator is a weighted sum, $w_1T_{S1}+w_2T_{S2}$, where $w_1+w_2=1$. The weights, $w_1$, $w_2$ are controllable by the control voltage, $V_c$.

Each stage S1, S2 comprises three transistors, T1, T2, and T3, wherein transistors T1 and T2 are connected in parallel with respect, to each other, and in series with respect to transistor T3. The transistors, T1 and T2, are also connected to resistors R.

The delay interpolator includes input terminals for receiving a control voltage. In the stage, S1, the input terminal for receiving the positive control voltage, Vc+, is connected to the gate of transistor T3 of stage S1, while the terminal for receiving the negative control voltage, Vc−, is connected to the gate of transistor T3 of stage S2.

In the stage S2, resistor/capacitor (RC) circuits, RC1, RC2, are connected to the gates of the transistors T1, T2, respectively. The input terminal for receiving positive Inp is connected to the resistor portion of the RC circuit RC1. The input terminal for receiving Inn, is connected to the resistor portion of the RC circuit RC2. The output of the delay interpolator is the differential voltage between the drains of transistors T1 and T2 of the first stage S1 and the second stage S2. These outputs are subsequently connected to the inputs of the next delay cell. However, the positive output of the current delay cell is connected to the negative input of the next delay cell, while the negative output of the current delay cell is connected to the positive input of the next delay cell. The foregoing connection causes the phase shift resulting in the control of the Vco frequency.

The phase lock loop as described herein may be implemented as a board level product, as a single chip, application specific integrated circuit, or with varying levels of the phase lock loop integrated on a single chip with other portions of the system as separate components. The degree of integration of the monitoring system will primarily be determined by the data speeds, and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor can be implemented as part of an ASIC device.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. A method for providing output signals with a plurality of frequencies, said method comprising:

comparing phases between an input signal and *a* feedback signal;

generating a frequency signal, wherein the frequency signal is dependent on [the] *a* difference between [the] *a* phase of the input signal and [the] *a phase of the* feedback signal; and dividing [the] *a* frequency of the frequency signal by a plurality of divider paths, wherein at least one divider forms a portion of at least two of the plurality of divider paths,

*wherein the at least one divider that forms the portion of the at least two of the plurality of divider paths is directly coupled to a next divider in at least one of the plurality of divider paths, and wherein each of the at least two of the plurality of divider paths after the at least one divider includes a plurality of dividers.*

2. The method of claim 1, further comprising outputting a plurality of output frequency signals.

3. The method of claim 2, wherein the plurality of output frequency signals further comprise an OC-3 signal, an OC-12 signal, an OC-48 signal, and a Gigabit Ethernet signal.

*4. The method of claim 2, further comprising deriving the plurality of output frequency signals from an output signal of a phase lock loop.*

*5. The method of claim 2, further comprising providing a first one of the plurality of output frequency signals to a transmitter or a receiver.*

*6. The method of claim 2, further comprising providing a first one of the plurality of output frequency signals to a transmitter to transmit data.*

*7. The method of claim 6, wherein the first one of the plurality of output frequency signals is a high frequency clock signal.*

*8. The method of claim 6, wherein the first one of the plurality of output frequency signals is a signal with a frequency on the order of $10^8$ Hz.*

*9. The method of claim 6, wherein the data is transmitted at one of a plurality of different data rates.*

*10. The method of claim 6, wherein the data is transmitted with one of a plurality of different formats.*

*11. The method of claim 2, further comprising providing a first one of the plurality of output frequency signals to a receiver to receive data.*

*12. The method of claim 11, wherein the first one of the plurality of output frequency signals is a high frequency signal.*

*13. The method of claim 11, wherein the first one of the plurality of output frequency signals is a signal with a frequency on the order of $10^8$ Hz.*

*14. The method of claim 11, wherein the data is received at one of a plurality of different possible data rates.*

*15. The method of claim 11, wherein the data is received in one of a plurality of different possible formats.*

*16. The method of claim 1, wherein the comparing phases includes comparing phases in a phase detector, the method further comprising:*

*providing a first output signal from a first divider path of the plurality of divider paths as a second feedback signal to the phase detector, and*

*providing a second output signal from a second divider path of the plurality of divider paths as a second frequency signal to a transmitter.*

*17. The method of claim 16, further comprising:*

*controlling the frequency of the feedback signal using a control signal.*

*18. The method of claim 1, further comprising:*

*comparing the phases in a phase detector,*

*providing a first output signal from a first divider path of the plurality of divider paths as a second feedback signal to the phase detector, and*

*providing a second output signal from a second divider path of the plurality of divider paths to a receiver.*

*19. The method of claim 18, further comprising:*

*controlling the frequency of the feedback signal using a control signal.*

*20. The method of claim 1, wherein the generating is performed by a plurality of voltage controlled oscillators (VCOs), each of which provides a respective VCO signal.*

*21. The method of claim 20, wherein the generating comprises selecting one of the plurality of VCO signals with a multiplexer.*

*22. The method of claim 1, further comprising:*

*generating a plurality of output signals for a transmitter; and*

*selecting, with a multiplexer, one of the plurality of output signals to be provided to the transmitter.*

*23. The method of claim 1, wherein the comparing phases includes comparing phases in a phase detector, the method further comprising:*

*providing a first output signal from a first divider path of the plurality of divider paths as a second feedback signal to the phase detector,*

*providing a second output signal from a second divider path of the plurality of divider paths as a second frequency signal to a transmitter, and*

*using the second frequency signal for transmitting data,*

*wherein the transmitting data includes transmitting with one of a plurality of data rates.*

*24. A method for providing output signals with a plurality of frequencies, said method comprising:*

*comparing phases between an input signal and a feedback signal;*

*generating a frequency signal, wherein the frequency signal is dependent on a difference between a phase of the input signal and a phase of the feedback signal; and*

*dividing a frequency of the frequency signal by a plurality of divider paths, wherein at least one divider forms a portion of at least two of the plurality of divider paths,*

*wherein the dividing further comprises, after the dividing in the at least one divider that forms the portion of the at least two of the plurality of divider paths, providing a signal to the at least one divider, then to a multiplexer and then to a series of dividers.*

*25. The method of claim 24, further comprising outputting a plurality of output frequency signals.*

*26. The method of claim 25, further comprising deriving the plurality of output frequency signals from an output signal of a phase lock loop.*

*27. The method of claim 25, further comprising providing a first one of the plurality of output frequency signals to a transmitter or a receiver.*

*28. The method of claim 24, wherein the generating is performed by a plurality of voltage controlled oscillators (VCOs), each of which provides a respective VCO signal.*

*29. A method for providing output signals with a plurality of frequencies, said method comprising:*

*comparing phases between an input signal and a feedback signal;*

*generating a frequency signal, wherein the frequency signal is dependent on a difference between a phase of the input signal and a phase of the feedback signal;*

*dividing a frequency of the frequency signal by a plurality of divider paths, wherein at least one divider forms a portion of at least two of the plurality of divider paths;*

*providing a signal divided by the at least one divider to a multiplexer; and*

*providing a signal output by the multiplexer to an additional divider.*

* * * * *

UNITED STATES PATENT AND TRADEMARK OFFICE

CERTIFICATE OF CORRECTION

PATENT NO. : RE45,557 E
APPLICATION NO. : 13/935098
DATED : June 9, 2015
INVENTOR(S) : Caresosa et al.

It is certified that error appears in the above-identified patent and that said Letters Patent is hereby corrected as shown below:

Column 1, line 18, please insert: --Notice: More than one reissue application has been filed for the reissue of U.S. Patent No. 7,053,720. The reissue application numbers are U.S. Patent Application No. 13/925,098 (the present application), filed July 3, 2013 and U.S. Patent Application No. 14/732,148, filed June 5, 2015. U.S. Patent Application No. 14/732,148 is a continuation reissue of U.S. Patent Application No. 13/935,098.--

Signed and Sealed this
Fifteenth Day of March, 2016

Michelle K. Lee

Michelle K. Lee
*Director of the United States Patent and Trademark Office*